United States Patent
Shindo et al.

(10) Patent No.: US 6,270,593 B1
(45) Date of Patent: Aug. 7, 2001

(54) MN ALLOY MATERIALS FOR MAGNETIC MATERIALS, MN ALLOY SPUTTERING TARGETS, AND MAGNETIC THIN FILMS

(75) Inventors: Yuichiro Shindo; Tsuneo Suzuki, both of Toda (JP)

(73) Assignee: Japan Energy Corporation, Tokyo ( * ) Notice: Subject to any disclaimer, the term of this patent is extended or adjusted under 35 U.S.C. 154(b) by 0 days.

(21) Appl. No.: 09/123,294

(22) Filed: Jul. 28, 1998

(30) Foreign Application Priority Data

Jul. 31, 1997 (JP) .................................... 9-219012
Nov. 18, 1997 (JP) .................................... 9-332286

(51) Int. Cl.$^7$ ............................ C22C 30/00; H01L 1/147
(52) U.S. Cl. .................... 148/442; 148/314; 148/315; 148/423; 148/424; 148/425; 148/430; 420/72; 420/428; 420/434; 420/435; 420/461; 420/466; 420/580; 420/581
(58) Field of Search ..................................... 148/424, 314, 148/300, 315, 423, 425, 430, 442; 420/434, 72, 428, 435, 461, 466, 580, 581

(56) References Cited

U.S. PATENT DOCUMENTS

| | | | |
|---|---|---|---|
| 2,259,459 | * | 10/1941 | Dean . |
| 2,329,698 | * | 9/1943 | Dean . |
| 4,282,032 | * | 8/1981 | Nagoya et al. . |
| 4,354,868 | * | 10/1982 | Demange et al. . |
| 4,415,529 | * | 11/1983 | Masumoto et al. .................. 420/434 |

\* cited by examiner

*Primary Examiner*—John Sheehan
(74) *Attorney, Agent, or Firm*—Akin, Gump, Strauss, Hauer & Feld, L.L.P.

(57) ABSTRACT

Mn alloy materials for magnetic materials contain 500 ppm or less, preferably 100 ppm or less, oxygen, 100 ppm or less, probably 20 ppm or less, sulfur, and preferably a total of 1000 ppm or less, more preferably 500 ppm or less, impurities (elements other than Mn and the alloying component). The alloying component that forms an alloy with Mn is one or two or more elements selected from the group consisting of Fe, Ir, Pt, pd, Rh, Ru, Ni, Cr and Co. Sputtering targets formed from the Mn alloy materials for use in depositing magnetic thin film, and the thin films so produced.

6 Claims, No Drawings

MN ALLOY MATERIALS FOR MAGNETIC MATERIALS, MN ALLOY SPUTTERING TARGETS, AND MAGNETIC THIN FILMS

BACKGROUND OF THE INVENTION

This invention relates to Mn alloy materials for magnetic materials, Mn alloy sputtering targets, and magnetic thin films. More particularly, this invention relates to Mn alloys for anti-ferromagnetic thin films, Mn alloy sputtering targets, and anti-ferromagnetic thin films.

Magnetic recording media for computers, such as hard disks, have in recent years been rapidly reduced in size but expanded in capacity; recording densities as high as 200 Gb/in$^2$ are expected to be realized in years to come. Accordingly, recording heads of the conventional induction type have approached the limit of their utility and are being supplanted by magnetoresistance effect type (AMR) heads. The spread of the personal computer market promises dramatic growth of demand for the AMR heads on the global basis. In a few years the heads of giant magnetoresistance effect type (GMR) with even greater density potential will come in practical use.

GMR heads use a spin valve film of antimagnetic film, and Mn alloys have been studied as possible materials for forming the antimagnetic film.

Mn alloys, especially Mn-Fe alloys and the like, are investigated for the particular application. However, the use of Mn—Fe alloys in fact has a rather unlikely prospect because of their questionable corrosion resistance. Attempts have been made to improve the corrosion resistance by adding noble metals to Mn. The problems they present are that the noble metals are expensive and even the addition of such metals has not enhanced the resistance to a fully satisfactory level.

OBJECT OF THE INVENTION

This invention aims at providing means for forming excellently corrosion-resistant, antimagnetic films.

SUMMARY OF THE INVENTION

With the view of settling the problems of the prior art, the present inventors have made intensive research. As a result, it has now been found that impurity elements, especially oxygen and sulfur, in Mn alloys deteriorate the corrosion resistance.

This invention, on the basis of the above finding, provides:

1. an Mn alloy material for magnetic materials characterized in that it contains 500 ppm or less oxygen and 100 ppm or less sulfur,
2. an Mn alloy material for magnetic materials characterized in that it contains a total of 1000 ppm or less impurities (other than Mn and the alloying component), wherein it contains 500 ppm or less oxygen and 100 ppm or less sulfur,
3. an Mn alloy material for magnetic materials characterized in that it contains a total of 500 ppm or less impurities (other than Mn and the alloying component), wherein 100 ppm or less oxygen, and 20 ppm or less sulfur, and
4. an alloy material according to 1, 2, or 3 above characterized in that the alloying component that constitutes the alloy with Mn is one or two or more elements selected from the group consisting of Fe, Ir, Pt, Pd, Rh, Ru, Ni, Cr, and Co.

This invention also provides:

5. a Mn alloy sputtering target for forming a magnetic thin film characterized in that it contains 500 ppm or less oxygen and 100 ppm or less sulfur,
6. a Mn alloy sputtering target for forming a magnetic thin film characterized in that it contains a total of 1000 ppm or less impurities (other than Mn and the alloying component), wherein it contains 500 ppm or less oxygen and 100 ppm or less sulfur,
7. a Mn alloy sputtering target for forming a magnetic thin film characterized in that it contains a total of 500 ppm or less impurities (other than M n and the alloying component), wherein it contains 100 ppm or less oxygen and 20 ppm or less sulfur.
8. a sputtering target according to 5, 6, or 7 above characterized in that the alloying component that constitutes the alloy with Mn is one or two or more elements selected from the group consisting of Fe, Ir, Pt, Pd, Rh, Ru, Ni, Cr, and Co.

This invention further provides:

9. a magnetic thin film characterized in that it is formed by sputtering with an Mn alloy sputtering target for forming magnetic thin film according to any of 5 to 8 above.

DETAILED DESCRIPTION OF THE PREFERRED EMBODIMENTS

An Mn alloy material for magnetic materials according to this invention consists of an alloy containing Mn as its main constituent. Alloying components other than Mn include Fe, Ir, Pt, Pd, Rh, Ru, Ni, Cr, and Co. In particular, alloys of Mn—Fe, Mn—Ir, and Mn—Rh—Ru systems are useful for forming antimagnetic films. For example, these alloys have the following compositional ranges:

Mn—Fe alloy: 30–70 wt % Mn—70–30 wt % Fe,
Mn—Ni alloy: 60–90 wt % Mn—40–10 wt % Ni,
Mn—Pt alloy: 10–40 wt % Mn—90–60 wt % Pt,
Mn—Ir alloy: 30–70 wt % Mn—70–30 wt % Ir,
Mn—Pd—Pt alloy: 15–45 wt % Mn—15–45 wt % Pd—25–55 wt % Pt,
Mn—Rh—Ru alloy: 60–80 wt % Mn—15–35 wt % Rh—0–15 wt % Ru,
Mn—Co alloy: 30–70 wt % Mn—70–30 wt % Co,
Mn—Cr alloy: 30–70 wt % Mn—70–30 wt % Cr.

The alloy material according to this invention has lower oxygen and sulfur contents than usual. Oxygen and sulfur are major elements that deteriorate the corrosion resistance of the alloy. The oxygen content should be reduced to 500 ppm or less, preferably 100 ppm or less, and the sulfur content to 100 ppm or less, preferably 20 ppm or less.

Also desirable is the reduction of the impurity level; the total content of the elements other than Mn and the alloying component is reduced to 1000 ppm or below. The impurities or elements other than Mn and the alloying component deteriorate the magnetic characteristics and can lower the corrosion resistance of the resulting alloy. Therefore, the impurity content should be minimized to a total amount of 1000 ppm or less, preferably 500 ppm or less. A total impurity content of more than 1000 ppm is undesirable because it seriously aggravates the magnetic characteristics and corrosion resistance.

The Mn alloy material thus reduced in the impurity content can be produced in the following way.

In view of the fact that the impurities, especially oxygen and sulfur, in the Mn alloy are derived from the electrolytic Mn as the starting material, the inventors purified the material Mn to a higher purity than before.

Commercially available electrolytic Mn was subjected to high frequency melting with the addition of Ca, Mg, La, etc. as deoxidizers to remove oxygen and sulfur. The melting is preferably carried out in an inert gas atmosphere under reduced pressure, since it satisfactorily reduces the levels of impurity elements other than oxygen and sulfur too.

As an alternative method for highly purifying Mn, it is possible to premelt electrolytic Mn and then subject the melt to vacuum distillation, whereby the impurity level is lowered.

The alloying component other than Mn should also be as high in purity as possible. When they are procured from the market, highly pure products with a purity of at least 99.9% each should be used. Where necessary, they are freed from gaseous impurities and the like, e.g., by vacuum degassing.

The Mn and alloying components other than Mn thus obtained are melted together for alloying and the melt is cast. The alloy ingot so obtained is machined to a sputtering target material. Basically the purity of the target is equal to that of the ingot.

The sputtering target obtained this way is used in sputtering to deposit a magnetic thin film.

EXAMPLES

The invention is illustrated by the following examples, which are in no way limitative.

Example 1

Electrolytic Mn as a starting material was melted using high frequencies in an MgO crucible. The atmosphere was of Ar. When the temperature reached 1400° C., 1 wt % Ca was added as a deoxidizer. The melt was held for 5 minutes and, after the removal of slags through a tundish, cast into a mold. After cooling, an ingot was taken out. An Mn containing 360 ppm oxygen and 150 ppm sulfur, and containing a total of 941 ppm impurities was obtained.

The Mn thus obtained and a commercially available Fe having a purity of 99.9% to 99.99% (containing 320 ppm oxygen and 40 ppm sulfur) were melted together in a ratio of 1:1 for alloying. An Mn—Fe alloy resulted which contained 340 ppm oxygen, 90 ppm sulfur, and a total of 668 ppm impurities (elements other than Mn and Fe).

The compositions of the starting materials and the resulting Mn—Fe alloy are shown in Table 1.

The Mn—Fe alloy obtained was partly cut off to provide an about 10 mm square piece as a block test piece for corrosion resistance test.

The surface of the block test piece for corrosion resistance test to be observed was finished mirror-like and the piece was placed in a humid tester at a temperature of 35° C. and humidity of 98%. 72 hours later, the test piece was taken out and visually inspected for its rusting condition.

The remainder of the Mn—Fe alloy was machined to provide a sputtering target in the form of a disk 50 mm in diameter and 5 mm thick. This sputtering target was bonded to a copper backing plate with an In—Sn alloy solder, and the backed target was tested for sputtering in a magnetron sputtering system. A thin Mn—Fe alloy film was deposited on a 3-in. Si wafer.

The number of particles 0.3 m or larger in diameter that were found present on the wafer was counted.

Example 2

Material electrolytic Mn was melted by high-frequency heating in an MgO crucible. An Ar atmosphere was used. When the temperature reached 1400° C., 1 wt % La was added as a deoxidizer. The melt was held for 5 minutes and, after the removal of slags through a tundish, cast into a mold. After cooling, an ingot was taken out. An Mn containing 50 ppm oxygen, 10 ppm sulfur, and a total of 221 ppm impurities was obtained.

The Mn thus obtained and a commercially available Fe having a purity of 99.9% to 99.99% (containing 120 ppm oxygen and 40 ppm sulfur) were melted together in a ratio of 1:1 for alloying. An Mn—Fe alloy containing 110 ppm oxygen, 25 ppm sulfur, and a total of 238 ppm impurities (elements other than Mn and Fe) was obtained.

The compositions of the materials and the resulting Mn—Fe alloy are shown in Table 2.

A corrosion resistance test and a sputtering test were conducted in the same manner as described in Example 1.

Example 3

Material electrolytic Mn was high-frequency melted in an MgO crucible. An Ar atmosphere was used. When the temperature reached 1400° C., 1 wt % La was added as a deoxidizer. The melt was held for 5 minutes and, after slag removal through a tundish, cast into a mold. After cooling, an ingot was taken out. An Mn containing 50 ppm oxygen, 10 ppm sulfur, and a total of 221 ppm impurities was obtained.

The Mn thus obtained and a commercially available Fe having a purity of 99.99% (containing 50 ppm oxygen and 1 ppm sulfur) were melted together in a ratio of 1:1 for alloying. An Mn—Fe alloy containing 50 ppm oxygen, 6 ppm sulfur, and a total of 132 ppm impurities (elements other than Mn and Fe) was obtained.

The compositions of the materials and the resulting Mn—Fe alloy are shown in Table 3.

A corrosion resistance test and a sputtering test were conducted in the same manner as described in Examples 1 and 2.

Example 4

Material electrolytic Mn was high-frequency melted in an MgO crucible. An Ar atmosphere was used. When the temperature reached 1400° C., 1 wt % Ca was added as a deoxidizer. The melt was held for 5 minutes and, after slag removal through a tundish, cast into a mold. After cooling, an ingot was taken out. An Mn containing 160 ppm oxygen, 170 ppm sulfur, and a total of 493 ppm impurities was obtained.

The Mn thus obtained and Ir (containing 500 ppm oxygen and 1 ppm sulfur) that had been obtained by vacuum degassing a commercially available Ir powder having a purity of 99.0 to 99.9% (1300 ppm oxygen and 1 ppm sulfur) were melted together in a ratio of 55:45 for alloying. An Mn—Ir alloy containing 330 ppm oxygen, 90 ppm sulfur, and a total of 564 ppm impurities (elements other than Mn and Ir) was obtained.

The compositions of the materials and the resulting Mn—Ir alloy are shown in Table 4.

A corrosion resistance test and a sputtering test were conducted in the same manner as described in Examples 1 to 3.

Example 5

Material electrolytic Mn was high-frequency melted in an MgO crucible. An Ar atmosphere was used. When the temperature reached 1400° C., 1 wt % La was added as a deoxidizer. The melt was held for 5 minutes and, after slag removal through a tundish, cast into a mold. After cooling, an ingot was taken out. An Mn containing 50 ppm oxygen, 10 ppm sulfur, and a total of 223 ppm impurities was obtained.

The Mn thus obtained and Ir (containing 100 ppm oxygen and 1 ppm sulfur) that had been obtained by vacuum degassing a commercially available Ir powder having a purity of 99.0 to 99.9% (1300 ppm oxygen and 1 ppm sulfur) were melted together in a ratio of 1:1 for alloying.

An Mn—Ir alloy containing 70 ppm oxygen, 6 ppm sulfur, and a total of 220 ppm impurities (elements other than Mn and Ir) was obtained.

The compositions of the materials and the resulting Mn—Ir alloy are shown in Table 5.

A corrosion resistance test and a sputtering test were conducted in the same manner as described in Examples 1 to 4.

Example 6

Material electrolytic Mn was premelted at 1300° C. in an MgO crucible and was vacuum distilled at 1400° C. The vacuum degree was $10^{-2}$ Torr, distillation temperature was 1400° C., and holding time was 30 minutes. The distilled Mn contained 100 ppm oxygen, 50 ppm sulfur, and a total of 482 ppm impurities.

The Mn thus obtained and a commercially available, 99.9%-pure Fe (containing 200 ppm oxygen and 70 ppm sulfur) were melted together in an MgO crucible in a ratio of 1:1 to for alloying. An Mn—Fe alloy containing 100 ppm oxygen, 50 ppm sulfur, and a total of 482 ppm impurities (elements other than Mn and Fe) was obtained.

The compositions of the materials and the resulting Mn—Fe alloy are shown in Table 6.

A corrosion resistance test and a sputtering test were conducted in the same manner as described in Examples 1 to 5.

Example 7

Material electrolytic Mn was premelted at 1300° C. in an $Al_2O_3$ crucible and was vacuum distilled at 1400° C. The vacuum degree was $10^{-2}$ Torr, distillation temperature was 1400° C., and holding time was 30 minutes. The distilled Mn contained 30 ppm oxygen, 10 ppm sulfur, and a total of 122 ppm impurities.

The Mn thus obtained and a commercially available, 99.99%-pure Fe (containing 40 ppm oxygen and 10 ppm sulfur) were melted together in an $Al_2O_3$ crucible in a ratio of 1:1 for alloying. An Mn—Fe alloy containing 50 ppm oxygen, 10 ppm sulfur, and a total of 106 ppm impurities (elements other than Mn and Fe) was obtained.

The compositions of the materials and the resulting Mn—Fe alloy are shown in Table 7.

A corrosion resistance test and a sputtering test were conducted in the same manner as described in Examples 1 to 6.

Example 8

Material electrolytic Mn was premelted at 1300° C. in an MgO crucible and was vacuum distilled at 1400° C. The vacuum degree was $10^{-2}$ Torr, distillation temperature was 1400° C., and holding time was 30 minutes. The distilled Mn contained 100 ppm oxygen, 20 ppm sulfur, and a total of 382 ppm impurities.

The Mn thus obtained and an Ir powder (containing 250 ppm oxygen and <10 ppm sulfur) that had been obtained by vacuum degassing a commercially available, 99.9%-pure Ir powder (1300 ppm oxygen and <10 ppm sulfur) were melted together in an MgO crucible in a ratio of 1:1 for alloying. An Mn—Ir alloy containing 180 ppm oxygen, 10 ppm sulfur, and a total of 473 ppm impurities (elements other than Mn and Ir) was obtained.

The compositions of the materials and the resulting Mn—Ir alloy are shown in Table 8.

A corrosion resistance test and a sputtering test were conducted in the same manner as described in Examples 1 to 7.

Example 9

Material electrolytic Mn was premelted at 1300° C. in an $Al_2O_3$ crucible and was vacuum distilled at 1400° C. The vacuum degree was $10^{-2}$ Torr, distillation temperature was 1400° C., and holding time was 30 minutes. The distilled Mn contained 30 ppm oxygen, <10 ppm sulfur, and a total of 141 ppm impurities. The Mn thus obtained and an Ir powder (containing 100 ppm oxygen and <10 ppm sulfur) that had been obtained by vacuum degassing a commercially available, 99.9%-pure Ir powder (1300 ppm oxygen and <10 ppm sulfur) were melted together in an $Al_2O_3$ crucible in a ratio of 55:45 for alloying. An Mn—Ir alloy containing 70 ppm oxygen, 10 ppm sulfur, and a total of 175 ppm impurities (elements other than Mn and Ir) was obtained.

The compositions of the materials and the resulting Mn—Ir alloy are shown in Table 9.

A corrosion resistance test and a sputtering test were conducted in the same manner as described in Examples 1 to 8.

Comparative Example 1

Material Mn powder having a purity of 99.0 to 99.9% (containing 1000 ppm oxygen and 400 ppm sulfur) and a commercially available, 99.9%-pure Fe (containing 120 ppm oxygen and 40 ppm sulfur) were melted in a ratio of 1:1 for alloying. An Mn—Fe alloy containing 600 ppm oxygen, 220 ppm sulfur, and a total of 1220 ppm impurities (elements other than Mn and Fe) was obtained.

The compositions of the materials and the resulting Mn—Fe alloy are shown in Table 10.

A corrosion resistance test and a sputtering test were conducted in the same manner as described in Examples.

Comparative Example 2

Material Mn powder having a purity of 99.0 to 99.9% (containing 1000 ppm oxygen and 400 ppm sulfur) and a commercially available, 99.0–99.9%-pure Ir powder (containing 1300 ppm oxygen and 400 ppm sulfur) were melted in a ratio of 55:45 for alloying. An Mn—Ir alloy containing 1100 ppm oxygen, 200 ppm sulfur, and a total of 2100 ppm impurities (elements other than Mn and Ir) was obtained.

The compositions of the materials and the resulting Mn—Ir alloy are shown in Table 11.

A corrosion resistance test and a sputtering test were conducted in the same manner as described in Examples.

Comparative Example 3

Material Mn powder having a purity of 99.9% (containing 1000 ppm oxygen and 400 ppm sulfur) and a commercially available, 99.9%-pure Fe (containing 120 ppm oxygen and 40 ppm sulfur) were melted in a ratio of 1:1 for alloying. An Mn—Fe alloy containing 560 ppm oxygen, 220 ppm sulfur, and a total of 1631 ppm impurities (elements other than Mn and Fe) was obtained.

The compositions of the materials and the resulting Mn—Fe alloy are shown in Table 12.

A corrosion resistance test and a sputtering test were conducted in the same manner as described in Examples.

Comparative Example 4

Material Mn powder having a purity of 99.0 to 99.9% (containing 1000 ppm oxygen and 400 ppm sulfur) and a commercially available, 99.0–99.9%-pure Ir powder (containing 1300 ppm oxygen and 1 ppm sulfur) were melted in a ratio of 55:45 for alloying. An Mn—Ir alloy containing 1100 ppm oxygen, 200 ppm sulfur, and a total of 2443 ppm impurities (elements other than Mn and Ir) was obtained.

The compositions of the materials and the resulting Mn—Ir alloy are shown in Table 13.

A corrosion resistance test and a sputtering test were conducted in the same manner as described in Examples.

Results

The results of the corrosion resistance tests and the numbers of particles counted in the sputtering tests conducted in Examples 1 to 9 and Comparative Examples 1 to 4 are summarized in Table 14.

The results indicated that the Mn alloys according to this invention that contains 500 ppm or less oxygen and 100 ppm or less sulfur were superior in corrosion resistance to the alloys of the comparative examples. The Mn alloys that contained a total of 500 ppm or less impurities (elements other than Mn and the alloying component) exhibited even greater corrosion resistance. Above all, the Mn alloys containing 100 ppm or less oxygen, 20 ppm or less sulfur showed by far the greatest corrosion resistance.

It should also be clear that the targets of this invention produced much smaller numbers of particles on sputtering than those by the targets of the comparative examples.

Advantages of the Invention

The Mn alloy sputtering targets for forming magnetic thin films according to this invention are characterized by an oxygen content of 500 ppm or less, sulfur content of 100 ppm or less, and total impurity (elements other than Mn and the alloying component) content of 1000 ppm or less. The targets are useful as materials for forming magnetic thin films, since they can deposit excellently corrosion-resistant antimagnetic films.

TABLE 1

Example 1 unit: ppm

|     | Material Mn | Deoxidized Mn | Material Fe | Mn—Fe alloy |
|-----|-------------|---------------|-------------|-------------|
| Mn  | bal.        | bal.          | 1           | 50%         |
| Fe  | 20          | 20            | bal.        | 50%         |
| O   | 1000        | 360           | 320         | 340         |
| N   | 300         | 300           | 40          | 170         |
| S   | 400         | 150           | 30          | 90          |
| C   | 30          | 30            | 40          | 35          |
| H   | 120         | 1             | 8           | 1           |
| Pb  | 35          | <10           | 1           | 1           |
| Zn  | 110         | <10           | 1           | 1           |
| Si  | 20          | 20            | 2           | 10          |
| Se  | 10          | <10           | <1          | 4           |

TABLE 1-continued

Example 1 unit: ppm

|     | Material Mn | Deoxidized Mn | Material Fe | Mn—Fe alloy |
|-----|-------------|---------------|-------------|-------------|
| Mg  | 70          | <10           | <1          | <1          |
| Sn  | 10          | 10            | 1           | 5           |
| other impurities | 10 | <10 | <10 | <10 |
| Total of impurities | 2135 | 941 | 456 | 668 |

TABLE 2

Example 2 unit: ppm

|     | Material Mn | Deoxidized Mn | Material Fe | Mn—Fe alloy |
|-----|-------------|---------------|-------------|-------------|
| Mn  | bal.        | bal.          | 1           | 50%         |
| Fe  | 20          | 20            | bal.        | 50%         |
| O   | 1000        | 50            | 120         | 110         |
| N   | 300         | 30            | 40          | 35          |
| S   | 400         | 10            | 40          | 25          |
| C   | 30          | 30            | 40          | 35          |
| H   | 120         | 1             | 8           | 1           |
| Pb  | 35          | <10           | 1           | 1           |
| Zn  | 110         | <10           | 1           | 1           |
| Si  | 20          | 20            | 2           | 10          |
| Se  | 10          | <10           | <1          | 4           |
| Mg  | 70          | <10           | <1          | <1          |
| Sn  | 10          | 10            | 1           | 5           |
| other impurities | 10 | <10 | <10 | <10 |
| Total of impurities | 1865 | 221 | 266 | 238 |

TABLE 3

Example 3 unit: ppm

|     | Material Mn | Deoxidized Mn | Material Fe | Mn—Fe alloy |
|-----|-------------|---------------|-------------|-------------|
| Mn  | bal.        | bal.          | 1           | 50%         |
| Fe  | 20          | 20            | bal.        | 50%         |
| O   | 1000        | 50            | 50          | 50          |
| N   | 30          | 30            | 2           | 16          |
| S   | 400         | 10            | 1           | 6           |
| C   | 30          | 30            | 25          | 30          |
| H   | 120         | 1             | 8           | 1           |
| Pb  | 35          | <10           | 1           | <1          |
| Zn  | 110         | <10           | 1           | <1          |
| Si  | 20          | 20            | 1           | 10          |
| Se  | 10          | <10           | <1          | <1          |
| Mg  | 70          | <10           | <1          | <1          |
| Sn  | 10          | 10            | 1           | 5           |
| other impurities | 10 | <10 | <10 | <10 |
| Total of impurities | 1865 | 221 | 103 | 132 |

TABLE 4

Example 4 unit: ppm

|     | Material Mn | Deoxidized Mn | Material Ir | Degassed Ir | Mn—Ir alloy |
|-----|-------------|---------------|-------------|-------------|-------------|
| Mn  | bal. | bal. | 1    | 1    | 55% |
| Ir  | 0    | 0    | bal. | bal. | 45% |
| Fe  | 20   | 20   | 9    | 9    | 15  |
| O   | 1000 | 160  | 1300 | 500  | 330 |
| N   | 30   | 30   | 70   | 10   | 20  |
| S   | 400  | 170  | 1    | 1    | 90  |
| C   | 30   | 30   | 760  | 70   | 50  |
| H   | 120  | 1    | 50   | 1    | 1   |
| Pb  | 35   | <10  | <1   | <1   | <1  |
| Zn  | 110  | <10  | <1   | <1   | <1  |
| Si  | 20   | 20   | 3    | 3    | 12  |
| Se  | 10   | <10  | <1   | <1   | <1  |
| Mg  | 70   | <10  | 1    | 1    | <1  |
| Sn  | 10   | 10   | <1   | <1   | 5   |
| Ru  | 1    | <1   | 14   | 14   | 7   |
| Rh  | 1    | <1   | 35   | 35   | 20  |
| other impurities | 10 | <10 | <10 | <10 | <10 |
| Total of impurities | 1867 | 493 | 2258 | 659 | 564 |

TABLE 5

Example 5 unit: ppm

|     | Material Mn | Deoxidized Mn | Material Ir | Degassed Ir | Mn—Ir alloy |
|-----|-------------|---------------|-------------|-------------|-------------|
| Mn  | bal. | bal. | 1    | 1    | 55% |
| Ir  | 0    | 0    | bal. | bal. | 45% |
| Fe  | 20   | 20   | 9    | 9    | 15  |
| O   | 1000 | 50   | 1300 | 100  | 70  |
| N   | 30   | 30   | 70   | 10   | 20  |
| S   | 400  | 10   | 1    | 1    | 6   |
| C   | 30   | 30   | 760  | 70   | 50  |
| H   | 120  | 1    | 50   | 1    | 1   |
| Pb  | 35   | <10  | <1   | <1   | <1  |
| Zn  | 110  | <10  | <1   | <1   | <1  |
| Si  | 20   | 20   | 3    | 3    | 12  |
| Se  | 10   | <10  | <1   | <1   | <1  |
| Mg  | 70   | <10  | <1   | <1   | <1  |
| Sn  | 10   | 10   | <1   | <1   | 5   |
| Ru  | <1   | <1   | 14   | 14   | 7   |
| Rh  | <1   | <1   | 35   | 35   | 20  |
| other impurities | 10 | <10 | <10 | <10 | <10 |
| Total of impurities | 1867 | 223 | 2258 | 259 | 220 |

TABLE 6

Example 6 unit: ppm

|     | Material Mn | Distilled Mn | Material Fe | Mn—Fe alloy |
|-----|-------------|--------------|-------------|-------------|
| Mn  | bal. | bal. | 1    | 50% |
| Fe  | 20   | <1   | bal. | 50% |
| O   | 1000 | 100  | 200  | 150 |
| N   | 300  | 20   | 20   | 20  |
| S   | 400  | 50   | 70   | 60  |
| C   | 150  | 100  | 100  | 100 |
| H   | 120  | 1    | 1    | 1   |
| Pb  | 35   | 35   | 1    | 10  |
| Zn  | 110  | 1    | 1    | 1   |
| Si  | 20   | 10   | 2    | 15  |
| Se  | 10   | 5    | <1   | 3   |

TABLE 6-continued

Example 6 unit: ppm

|     | Material Mn | Distilled Mn | Material Fe | Mn—Fe alloy |
|-----|-------------|--------------|-------------|-------------|
| Mg  | 70   | 157  | <1   | 110 |
| Sn  | 10   | 1    | 1    | 1   |
| other impurities | 50 | 1 | 70 | 50 |
| Total of impurities | 2295 | 482 | 469 | 521 |

TABLE 7

Example 7 unit: ppm

|     | Material Mn | Distilled Mn | Material Fe | Mn—Fe alloy |
|-----|-------------|--------------|-------------|-------------|
| Mn  | bal. | bal. | 1    | 50% |
| Fe  | 20   | 1    | bal. | 50% |
| O   | 1000 | 30   | 40   | 50  |
| N   | 300  | <10  | <10  | <10 |
| S   | 400  | <10  | <10  | <10 |
| C   | 150  | 10   | 10   | 10  |
| H   | 120  | 1    | 1    | 1   |
| Pb  | 35   | 30   | 1    | 10  |
| Zn  | 110  | 1    | 1    | 1   |
| Si  | 20   | 10   | 2    | 5   |
| Se  | 10   | 5    | <1   | 2   |
| Mg  | 70   | 2    | <1   | <1  |
| Sn  | 10   | 1    | 1    | <1  |
| other impurities | 50 | 11 | 10 | 5 |
| Total of impurities | 2295 | 122 | 89 | 106 |

TABLE 8

Example 8 unit: ppm

|     | Material Mn | Distilled Mn | Material Ir | Degassed Ir | Mn—Ir alloy |
|-----|-------------|--------------|-------------|-------------|-------------|
| Mn  | bal. | bal. | 1    | 1    | 55% |
| Ir  | 0    | 1    | bal. | bal. | 45% |
| Fe  | 20   | 3    | 9    | 9    | 9   |
| O   | 1000 | 100  | 1300 | 250  | 180 |
| N   | 300  | 20   | 70   | 20   | 20  |
| S   | 400  | 20   | <10  | <10  | 10  |
| C   | 150  | 60   | 760  | 150  | 110 |
| H   | 120  | 1    | 50   | 1    | 1   |
| Pb  | 110  | 1    | <1   | <1   | <1  |
| Zn  | 20   | 10   | <1   | <1   | <1  |
| Si  | 10   | 5    | 3    | 3    | 10  |
| Se  | 70   | 50   | <1   | <1   | 20  |
| Mg  | 10   | 100  | 1    | 1    | 80  |
| Sn  | 50   | 1    | <1   | <1   | 1   |
| other impurities | 10 | <10 | 50 | 50 | 30 |
| Total of impurities | 2270 | 382 | 2258 | 499 | 473 |

TABLE 9

Example 9 unit: ppm

| | Material Mn | Distilled Mn | Material Ir | Degassed Ir | Mn—Ir alloy |
|---|---|---|---|---|---|
| Mn | bal. | bal. | 1 | 1 | 55% |
| Ir | 20 | 1 | bal. | bal. | 45% |
| Fe | 20 | 1 | 9 | 9 | 5 |
| O | 1000 | 30 | 1300 | 100 | 70 |
| N | 300 | <10 | 70 | <10 | <10 |
| S | 400 | <10 | <10 | <10 | <10 |
| C | 150 | 10 | 760 | 70 | 40 |
| H | 120 | 1 | 50 | 1 | 1 |
| Pb | 110 | 1 | <1 | <1 | <1 |
| Zn | 20 | 10 | <1 | <1 | <1 |
| Si | 10 | 5 | 3 | 3 | 5 |
| Se | 70 | 50 | <1 | <1 | 10 |
| Mg | 10 | 1 | 1 | 1 | 1 |
| Sn | 50 | 1 | <1 | <1 | 1 |
| other impurities | 10 | <10 | 50 | 50 | 20 |
| Total of impurities | 2270 | 141 | 2258 | 259 | 175 |

TABLE 10

Comparative Example 1 unit: ppm

| | Material Mn | Material Fe | Mn—Fe alloy |
|---|---|---|---|
| Mn | bal. | 50 | 50% |
| Fe | 20 | bal. | 50% |
| O | 1000 | 120 | 600 |
| N | 300 | 40 | 170 |
| S | 400 | 40 | 220 |
| C | 30 | 30 | 30 |
| H | 120 | 50 | 10 |
| Pb | 35 | 30 | 30 |
| Zn | 110 | 40 | 70 |
| Si | 20 | 40 | 30 |
| Se | 10 | <10 | <10 |
| Mg | 70 | <10 | 30 |
| Sn | 10 | <10 | 10 |
| other impurities | 10 | <10 | <10 |
| Total of impurities | 2135 | 480 | 1220 |

TABLE 11

Comparative Example 2 unit: ppm

| | Material Mn | Material Ir | Mn—Ir alloy |
|---|---|---|---|
| Mn | bal. | 1 | 55% |
| Ir | 0 | bal. | 45% |
| Fe | 20 | 9 | 15 |
| O | 1000 | 1300 | 1100 |
| N | 30 | 70 | 200 |
| S | 400 | 1 | 200 |
| C | 30 | 760 | 400 |
| H | 120 | 10 | 20 |
| Pb | 35 | <1 | 20 |
| Zn | 110 | <1 | 50 |
| Si | 20 | 5 | 15 |
| Se | 10 | <1 | 5 |
| Mg | 70 | <1 | 30 |
| Sn | 10 | <1 | 5 |
| Ru | <1 | 15 | 10 |
| Rh | <1 | 35 | 20 |

TABLE 11-continued

Comparative Example 2 unit: ppm

| | Material Mn | Material Ir | Mn—Ir alloy |
|---|---|---|---|
| other impurities | 10 | <10 | <10 |
| Total of impurities | 1867 | 2221 | 2100 |

TABLE 12

Comparative Example 3 unit: ppm

| | Material Mn | Material Fe | Mn—Fe alloy |
|---|---|---|---|
| Mn | bal. | 1 | 50% |
| Fe | 20 | bal. | 50% |
| O | 1000 | 120 | 560 |
| N | 200 | 30 | 120 |
| S | 400 | 40 | 220 |
| C | 300 | 15 | 230 |
| H | 120 | 1 | 1 |
| Pb | 100 | 5 | 50 |
| Zn | 110 | 5 | 60 |
| Si | 50 | 20 | 40 |
| Se | 60 | <1 | 30 |
| Mg | 70 | <1 | 40 |
| Sn | 50 | 10 | 30 |
| other impurities | 250 | 270 | 250 |
| Total of impurities | 2730 | 654 | 1631 |

TABLE 13

Comparative Example 4 unit: ppm

| | Material Mn | Material Ir | Mn—Ir alloy |
|---|---|---|---|
| Mn | bal. | 1 | 55% |
| Ir | 20 | bal. | 45% |
| Fe | 20 | 9 | 15 |
| O | 1000 | 1300 | 1200 |
| N | 200 | 70 | 110 |
| S | 400 | <10 | 200 |
| C | 300 | 760 | 520 |
| H | 120 | 50 | 1 |
| Pb | 100 | <1 | 15 |
| Zn | 110 | <1 | 50 |
| Si | 50 | 3 | 60 |
| Se | 60 | <1 | 40 |
| Mg | 70 | 1 | 30 |
| Sn | 50 | <1 | 40 |
| Ru | 10 | <1 | 6 |
| Rh | 10 | <1 | 6 |
| other impurities | 250 | 50 | 150 |
| Total of impurities | 2750 | 2260 | 2443 |

TABLE 14

| Example | Corro. resis. | Number of particles |
|---|---|---|
| 1 | Δ | 40 |
| 2 | ○ | 15 |

TABLE 14-continued

| Example | Corro. resis. | Number of particles |
|---|---|---|
| 3 | ⊚ | 10 |
| 4 | ○ | 30 |
| 5 | ⊚ | 15 |
| 6 | ○ | 30 |
| 7 | ⊚ | 5 |
| 8 | ⊚ | 40 |
| 9 | ⊚ | 10 |
| 1 | x | 130 |
| 2 | x | 200 |
| 3 | x | 140 |
| 4 | x | 200 |

⊚: Very good
○: Good to fair
Δ: Poor
x: very poor

What is claimed is:

1. An Mn alloy magnetic material having Mn and at least one alloying component, comprising a Mn alloy selected from the group consisting of (a) an alloy comprising 30–70 wt % Mn and 70–30 wt % Fe; (b) an alloy comprising 10–40 wt % Mn and 90–60 wt % Pt; (c) an alloy comprising 30–70 wt % Mn and 70–30 wt % Ir; (d) an alloy comprising 15–45 wt % Mn, 15–45 wt % Pd and 25–55 wt % Pt; (e) an alloy comprising 60–80 wt % Mn, 15–35 wt % Rh and 0–15 wt % Ru; (f) an alloy comprising 30–70 wt % Mn and 70–30 wt % Co; and (g) an alloy comprising 30–70 wt % Mn and 70–30 wt % Cr, wherein the Mn alloy magnetic material contains a total of 1000 ppm or less impurities, other than Mn and the alloying component; 500 ppm or less oxygen; and 100 ppm or less sulfur.

2. An Mn alloy material for magnetic materials according to claim 1 wherein the Mn alloy magnetic material contains a total of 500 ppm or less impurities, other than Mn and the alloying component; 100 ppm or less oxygen; and 20 ppm or less sulfur.

3. An Mn alloy sputtering target for forming a magnetic thin film comprising a Mn alloy having Mn and at least one alloying component, wherein the Mn alloy is selected from the group consisting of (a) an alloy comprising 30–70 wt % Mn and 70–30 wt % Fe; (b) an alloy comprising 10–40 wt % Mn and 90–60 wt % Pt; (c) an alloy comprising 30–70 wt % Mn and 70–30 wt % Ir; (d) an alloy comprising 15–45 wt % Mn, 15*14* 45 wt % Pd and 25–55 wt % Pt; (e) an alloy comprising 60–80 wt % Mn, 15–35 wt % Rh and 0–15 wt % Ru; (f) an alloy comprising 30–70 wt % Mn and 70–30 wt % Co; and (g) an alloy comprising 30–70 wt % Mn and 70–30 wt % Cr and wherein the Mn alloy contains a total of 1000 ppm or less impurities, other than Mn and the alloying component; 500 ppm or less oxygen; and 100 ppm or less sulfur.

4. An Mn alloy sputtering target for forming a magnetic thin film according to claim 3 wherein the Mn alloy contains a total of 500 ppm or less impurities, other than Mn and the alloying component; 100 ppm or less oxygen; and 20 ppm or less sulfur.

5. A magnetic thin film wherein the thin film is formed by sputtering the Mn alloy sputtering target for forming magnetic thin film according to claim 3.

6. A magnetic thin film wherein the thin film is formed by sputtering the Mn alloy sputtering target for forming magnetic thin film according to claim 4.

* * * * *

UNITED STATES PATENT AND TRADEMARK OFFICE
CERTIFICATE OF CORRECTION

PATENT NO. : 6,270,593 B1 Page 1 of 1
APPLICATION NO. : 09/123294
DATED : August 7, 2001
INVENTOR(S) : Yuichiro Shindo et al.

It is certified that error appears in the above-identified patent and that said Letters Patent is hereby corrected as shown below:

Column 14, line 13:

"1514 45 wt %" should read -- 15-45 wt %--.

Signed and Sealed this

Eleventh Day of December, 2007

JON W. DUDAS
*Director of the United States Patent and Trademark Office*